United States Patent [19]
DiStefano et al.

[11] Patent Number: 5,629,239
[45] Date of Patent: May 13, 1997

[54] MANUFACTURE OF SEMICONDUCTOR CONNECTION COMPONENTS WITH FRANGIBLE LEAD SECTIONS

[75] Inventors: Thomas H. DiStefano, Monte Sereno; John W. Smith, Palo Alto; Konstantine Karavakis, Cupertino; Joseph Fjelstad, Sunnyvale, all of Calif.

[73] Assignee: Tessera, Inc., San Jose, Calif.

[21] Appl. No.: 408,262

[22] Filed: Mar. 21, 1995

[51] Int. Cl.$^6$ ............................................. H01L 21/60
[52] U.S. Cl. ............................ 216/14; 438/111; 148/537; 29/827
[58] Field of Search ........................... 437/209, 214, 437/217, 219, 220; 257/666, 775, 776

[56] References Cited

U.S. PATENT DOCUMENTS

| | | | |
|---|---|---|---|
| 3,374,537 | 3/1968 | Doelp, Jr. | |
| 3,460,105 | 8/1969 | Birt et al. | |
| 4,234,666 | 11/1980 | Gorsky | 428/573 |
| 5,173,574 | 12/1992 | Kraus | 257/775 |
| 5,177,863 | 1/1993 | Lam | 257/786 |
| 5,221,428 | 6/1993 | Ohsawa et al. | 437/220 |
| 5,225,633 | 7/1993 | Wigginton | 257/666 |
| 5,230,144 | 7/1993 | Ootsuki | 437/220 |
| 5,266,520 | 11/1993 | Cipolla et al. | 437/220 |
| 5,354,422 | 10/1994 | Kato et al. | 437/220 |
| 5,432,127 | 7/1995 | Lamson et al. | 437/220 |

FOREIGN PATENT DOCUMENTS

94/03036  3/1994  WIPO .

*Primary Examiner*—Kevin Picardat

[57] ABSTRACT

A semiconductor chip connection component having numerous leads extending side-by-side across a gap in a support structure, each lead having a frangible section to permit detachment of one end of the lead from the support structure in a bonding process. The frangible sections are formed by treating the lead-forming material in an elongated treatment zone extending across the regions occupied by numerous leads. The process avoids the need for especially fine etching to form notches in the lateral edges of the leads.

23 Claims, 3 Drawing Sheets

MANUFACTURE OF SEMICONDUCTOR CONNECTION COMPONENTS WITH FRANGIBLE LEAD SECTIONS

FIELD OF THE INVENTION

The present invention relates to connection components useful in electrical assemblies such as in connecting semiconductor chips to substrates, and to methods of making such connection components.

BACKGROUND OF THE INVENTION

Semiconductor chips typically are connected to external circuitry through contacts on surface of the chip. The contacts may be disposed in a grid on the front surface of the chip or in elongated rows extending along the edges of the chip front surface. Each such contact must be connected to an external circuit element such as a circuit trace on a supporting substrate or circuit panel. In the conventional wire bonding process, the chip is physically mounted on the substrate. A bonding tool bearing a fine wire is engaged with an individual contact so as to bond the wire to the contact. The tool is then moved to a contact pad of the circuit on the substrate while dispensing wire through the tool until the tool engages the contact pad on the substrate and the wire is bonded thereto. This process is repeated for each contact.

In a tape automated bonding or "TAB" process, a dielectric supporting tape is provided with a hole slightly larger than the chip. Metallic leads are provided on the dielectric tape. An inner end of each lead projects inwardly beyond the edge of the hole. These plural leads are arranged side-by-side in rows. Each row of contacts on the chip is aligned with one such row of leads. The inner ends of the leads are bonded to the contacts of the chip by ultrasonic or thermocompression bonding. The outer ends of the leads are connected to the external circuitry.

The rapid evolution of the semiconductor art has created continued demand for incorporation of progressively greater numbers of contacts and leads in a given amount of space. With such closely spaced contacts, the leads connected to the contacts of the chip must be extremely fine structures, typically less than about 0.1 mm wide, disposed at center-to-center spacings of about 0.1 mm or less. Handling and connecting such fine, closely-spaced leads poses a formidable problem.

International Patent Publication WO94/03036, published 3 Feb. 1994 on copending International Application PCT/US93/06930, the disclosure of which is hereby incorporated by reference herein, offers a solution to these problems. As disclosed in the '036 publication, a semiconductor chip connection component may include a plurality of electrically conductive leads and may also include a support structure such as a flexible, dielectric film with a compliant, typically elastomeric underlayer disposed beneath the flexible film. Each such lead desirably is connected to a terminal disposed on the surface of the support structure. A connection section of each lead extends across a gap in the support structure. A first end of each connection section, connected to one of the terminals, is permanently attached to the support structure, whereas the opposite, second end of the connection section is releasably attached to the support structure. For example, the second end of each connection section may be connected through a frangible section connecting the second end to a bus structure anchored on the support structure.

Certain preferred connection components disclosed in the '036 publication have numerous elongated leads disposed side-by-side with the connection sections of the various leads extending across a common gap in the form of a slot in the support structure. In certain processes according to the '036 publication, the connection component is juxtaposed with the chip so that the support structure, and preferably a compliant layer thereof, overlies the contact-bearing surface of the chip and so that the gap or slot in the support structure is aligned with a row of contacts on the chip. This process serves to align each connection section with a contact on the chip. After placement of the connection component on the chip, each lead is engaged by a bonding tool. The bonding tool moves downwardly, towards the surface of the chip. As the bonding tool moves downwardly, it disengages the second end of each lead connection section from the support structure, as by breaking the frangible section of the lead, and moves the connection section downwardly into engagement with the chip contact. At the same time, guide surfaces on the bottom of the bonding tool engage the connection section and guide it into more precise alignment with the associated contact. The bonding tool then bonds the connection section to the contact.

The end-supported lead bonding processes according to preferred aspects of the '036 publication offer numerous advantages. Because each lead is supported at both ends prior to bonding, it can be maintained in position until it is captured by the bonding tool. The bonding tool will reliably capture the correct lead, and hence there is little chance that an incorrect lead will be bonded to a contact. The process can be performed at reasonable cost. Moreover, the products resulting from preferred processes according to the '036 publication, allow free movement of the terminals on the support structure relative to the chip after connection, both in the X and Y directions, parallel to the chip surface, and in the Z or compliance direction perpendicular to the chip surface. Thus, the assembly can be readily tested by engaging a multiple probe test fixture with the terminals. When the terminals on the support structure are bonded to contact pads of a substrate, as by solder bonding or other processes, the assembly can compensate for differential thermal expansion between the chip and the substrate, as by flexing of the leads and deformation of the flexible support structure.

Certain components and processes according to the '036 publication can be used to fabricate semiconductor chip assemblies with closely spaced leads. Merely by way of example, rows of connection section may be provided side-by-side at center-to-center spacings of about 100 micrometers or less, and may be successfully bonded to the contacts of the chip. Additional improvements in the bonding structures and techniques, as set forth in the copending, commonly assigned U.S. patent application Ser. No. 08/308, 741 of Thomas DiStefano et al., filed Sep. 19, 1994 entitled Microelectronic Bonding With Lead Motion, now U.S. Pat. No. 5,491,302 and in copending-pending commonly assigned U.S. patent application Ser. No. 08/096,693, filed Jul. 23, 1993, now U.S. Pat. No. 5,398,863 the disclosures of which are hereby incorporated by reference herein, still further facilitate bonding of closely spaced leads and formation of reliable assemblies even where the leads are extremely small, using the basic techniques set forth in the '036 publication.

However, manufacture of the preferred connection components for use in these processes has heretofore required precise control of photoforming processes. The leads utilized in certain end-supported lead bonding processes have incorporated connection sections of substantially uniform widths and frangible sections having widths less than the width of the connection section. For example, the frangible section may be defined by a pair of V-shaped notches extending inwardly towards one another in the widthwise direction from laterally opposite edges of the connection section. The width between the points of the V is substantially less than the width of the remaining portion of the connection section. Although this arrangement provides useful frangible sections, it imposes stringent requirements on the photoforming process. The process must be capable of forming feature sizes as small as the smallest width within the frangible section. Stated another way, the photoforming process must be more precise than required to form the connection sections themselves.

There has, accordingly, been a desire heretofore for improved methods of making connection components useful in end-supported lead bonding and for improved connection components. In particular, there has been a desire for processes which mitigate the requirement for precise photoforming steps in fabrication of such connection components.

SUMMARY OF THE INVENTION

The present invention addresses these needs:

One aspect of the present invention provides methods of making a semiconductor connection component. Methods according to this aspect of the invention desirably include the step of forming a plurality of leads, each extending over a gap in a support structure, each such lead including lead-forming material in an elongated, strip-like lead region extending in a lead direction. The methods further include the step of forming frangible sections in the leads by applying a weakening treatment to lead-forming material throughout an elongated treatment zone extending across a plurality of the lead regions transverse to the lead directions. Thus, the weakening treatment is applied without regard to the edge boundaries of the leads. Desirably, the lead regions extend side-by-side substantially parallel to one another in a common lead direction and the elongated treatment zone is substantially straight and extends transverse to this common lead direction. Thus, a row of leads extending side-by-side can be provided with weakened frangible regions. The weakening treatment may be applied after formation of the individual leads. Where the leads are formed in an additive plating process, the lead material may be deposited in the strip-like lead regions, and subsequently exposed to the weakening treatment. As discussed further below, the weakening treatment may include exposure to radiant energy, chemical etchants or alloying agents, or mechanical deformation by a tool. These treatments can be applied after formation of the leads throughout the treatment zone. For example, radiant energy or chemical agents can be applied using a mask having an elongated slot defining the treatment zone extending across plural lead regions. There is no need to control the extent of the weakening treatment precisely in the width-wise direction of the leads, transverse to the leads themselves. The process used to form the leads need not provide features any finer than the width of the individual lead connection sections themselves. Stated another way, the width of each lead connection section can be as fine as the finest feature size permitted by the photoforming process.

According to further aspects of the invention, the weakening treatment can be applied before or during the lead-forming step. For example, where leads are formed by subtractively etching a continuous layer of lead-forming material to form the individual leads, weakening treatments as mentioned above can be applied to the continuous layer along a similar elongated treatment zone before or during the etching step. Also, where the lead-forming process includes an additive plating process, the weakening treatment may include interrupting or partially interrupting the additive plating process within the elongated treatment zone. Thus, the substrate upon which the leads are formed may be provided with an elongated upstanding ridge extending through the treatment zone, so that the deposited material forms a notch surrounding the ridge during the deposition process itself. In these methods as well, the photoforming process used to make the leads need not create any feature finer than the width of the lead connection zones themselves.

As mentioned above, the weakening treatment may include application of radiant energy, as, for example, by directing radiant energy into a mask having a slot corresponding to the treatment zone, or by scanning a narrow beam of radiant energy, such as a laser beam, across the treatment zone. Intense radiant energy may ablate the lead-forming material in the treatment zone. Where the lead-forming material is susceptible to etching as, for example, where the lead-forming material is a copper or copper-based alloy, a similar slot-like mask may be used to control application of an etchant. Certain lead-forming materials such as gold, are susceptible to weakening by alloying agents. The alloying agent can be applied to gold lead-forming materials in the treatment zone either before or after formation of the individual leads.

The component fabrication process desirably also includes the step of treating the support structure to form a gap aligned with the lead connection sections and, desirably, also encompassing the weakened regions of the leads created within the treatment zone. For example, the support structure may be treated by etching or by laser ablation. Typically, the support structure includes a thin, flexible, polymeric film such as a polyimide. The support structure may be treated to form the gap either before or after formation of the leads and before or after application of the weakening treatment.

Further aspects of the invention provide semiconductor connection components. The connection components desirably include a plurality of leads extending across a gap in a support structure, preferably side-by-side and parallel to one another. Each such lead has a lengthwise dimension in the direction across the gap and a widthwise dimension transverse to the lengthwise direction. Each such lead has a connection section and a frangible section adjacent the connection section. The widthwise dimension of each lead within the connection section and the frangible section desirably is substantially constant. Thus, each lead may include a metal in a bond region and an alloy of the first metal with an alloying agent in the frangible region. Alternatively or additionally, the thickness of each lead perpendicular to the widthwise and lengthwise dimensions may be smaller in the frangible section than in the connection section.

These and other objects, features and advantages of the present invention will be more readily apparent from the detailed description of the preferred embodiments set forth below, taken in conjunction with the accompanying drawings.

Figure 2:
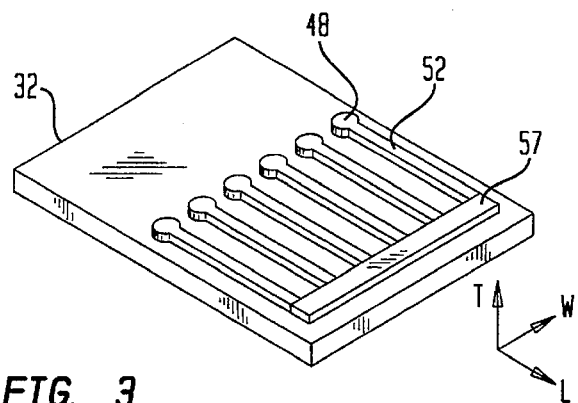
FIG. 2 is fragmentary, diagrammatic perspective view depicting a portion of the component illustrated in FIG. 1 during one stage of a manufacturing process in accordance with an embodiment of the invention.
Figure 3:
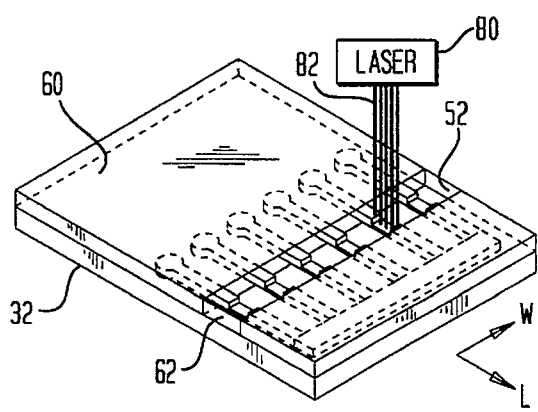
Figure 4:
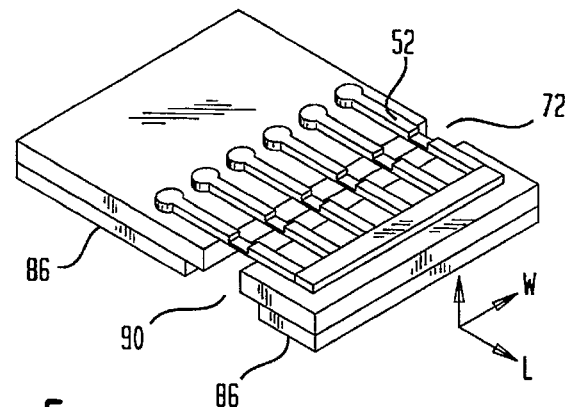
Figure 5:
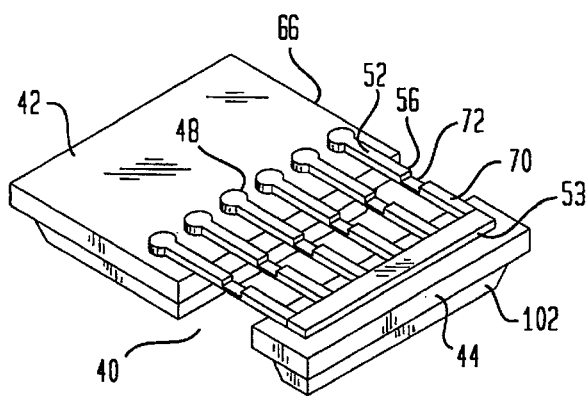

Each of FIGS. 3, 4 and 5 is a view similar to FIG. 2 but depicting the component at successively later stages of the process.

FIGS. 6, 7, 8, and 9 are views similar to FIG. 2 but depicting processes according to further embodiments of the invention.

Figure 10:
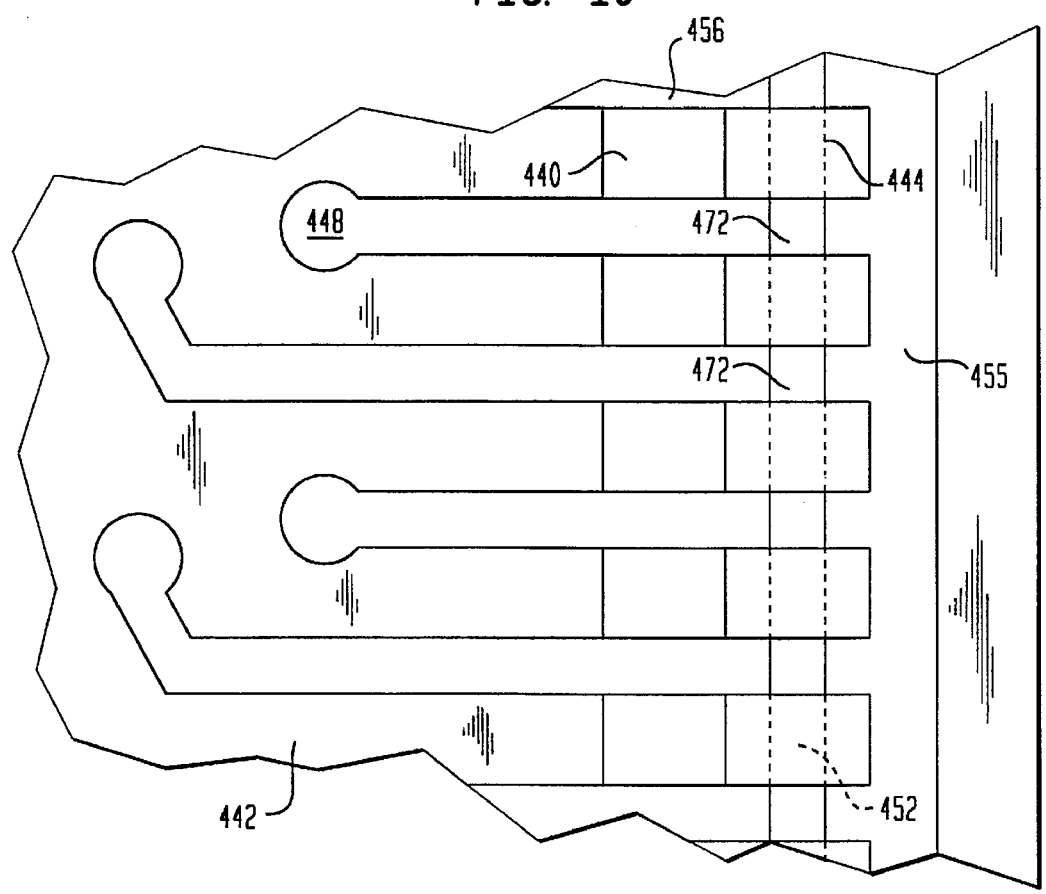

FIG. 10 is diagrammatic fragmentary top plan view of a component in accordance with another embodiment of the invention.

DETAILED DESCRIPTION OF THE PREFERRED EMBODIMENTS

A component in accordance with one embodiment of the invention is manufactured in the form of a continuous tape 28. The tape includes a plurality of components each incorporating a support structure 30. The support structure of each component incorporates a flexible, sheet-like dielectric layer 32 and also includes a soft, compliant layer 102 (FIG. 5), the compliant layer lying beneath the flexible dielectric layer 32. The support structure of each component has gaps in the form of slots 40 extending through it from its top surface to its bottom surface so as to subdivide the support structure of each component into a central portion 42 and a peripheral portion 44. The gaps merge with one another so that the central portion 42 of each component is not connected to the peripheral portion of the support structure by any other portion of the support structure. Rather, as discussed below, the central portion 42 is temporarily connected to the peripheral portion 44 of the support structure by the leads extending across gaps 40. The tape may be provided with features such as sprocket holes to facilitate feeding and movement of the tape in production processes.

Each component in accordance with this embodiment has a plurality of elongated electrically conductive buses 53 extending on the peripheral portion 44 of the dielectric layer alongside slots 40 so that one such bus extends alongside of, and substantially co-directionally with, each such slot. The buses 53 of each component form a generally rectilinear, hooplike structure encircling the gaps 40 and the central portion 42 of the support structure. Each component further has terminals 48 disposed on the central portion 42 of the support structure and a plurality of leads 52 extending outwardly from the terminals. Each lead 52 (FIG. 5) includes a first end securement section 66 on central portion 42; a connection section 56 extending outwardly across one of the gaps or slots 40 from the first end securement section; a frangible section 72 joined to the second or outer end of the connection section and a second end securement section 70 joining the frangible section 72 to the bus 53 lying alongside of the slot 40. As shown in FIG. 5, the frangible sections 72 lie just inside the outer margins of slots 40. The connection sections of all of the leads associated with any given slot extend generally perpendicular to the slot and generally side-by-side parallel to one another in a lead direction W. In the condition illustrated, the connection sections 56 and frangible sections 72 of the leads bridge gaps 40 and physically connect the central portion 42 of the support structure with the peripheral portion 44.

The general arrangement of the foregoing features may be substantially as illustrated in International Patent Publication WO94/03036.

Figure 1:
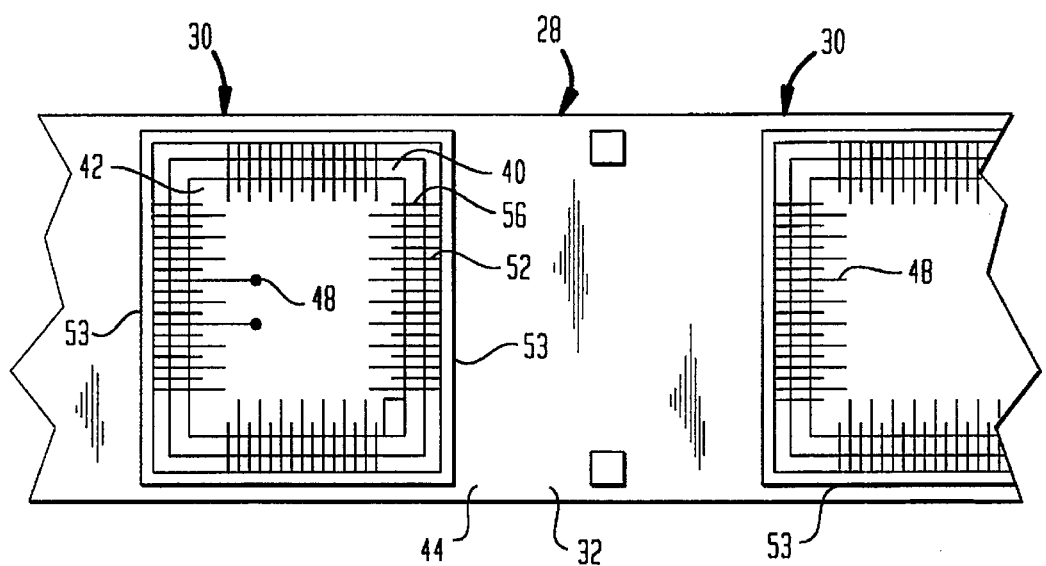
FIG. 1 is a fragmentary, diagrammatic plan view of a component in accordance with one embodiment of the present invention.

Components as illustrated in FIG. 1 can be made by a process as schematically illustrated in FIGS. 2–5. At the beginning of the process (FIG. 2), dielectric layer 32 is continuous and does not have the gaps 40 therein. While the dielectric layer is in this condition, buses 53, leads 52 and terminals 48 are formed from a conductive lead-forming material, such as gold, copper or alloys, by additive electroplating using a photographically patterned resist (not shown) with open areas corresponding to the buses, leads and terminals where plating is desired, or by subtractive etching from a continuous sheet of the lead-forming metallic material on the dielectric layer using a photographically patterned resist to permit etching only in areas where the lead-forming material is to be removed. The steps of the additive electroplating or subtractive etching processes may be performed in generally conventional ways. However, in this process the buses 53 provide electrical continuity to all of the leads and terminals.

Although only a few leads and terminals are illustrated in the drawings, it should be appreciated that a typical component may include hundreds of leads and terminals. Also, although the few terminals 48 illustrated in FIG. 2 are side-by-side, in practice the terminals are distributed over substantially the entire interior portion 42 of the dielectric layer. The portions of the leads which will form the connection sections are disposed in rows. Within each row, all of the lead connection sections extend in a lead direction L, and adjacent leads are spaced apart from one another in a widthwise direction W. The widthwise dimension of each lead desirably is between about 15 microns and about 50 microns whereas the center-to-center spacing between adjacent leads desirably is about 50 to about 100 microns. Each bus 53 desirably is about 50 to about 200 microns or more wide. At this stage of the process, all of the plated features have substantially uniform thickness in direction T transverse to the lengthwise and widthwise directions and perpendicular to the plane of the dielectric layer. The thickness desirably is between about 10 to about 30 microns. The aforementioned feature sizes can be achieved readily using conventional photoresist deposition, exposure and development techniques and conventional plating techniques. Preferably, each connection section is about 300 microns to about 1000 microns long.

In the next stage of the process, a mask 60 is applied over the surface of layer 32 and over the leads. The mask has slots 62 extending in the widthwise direction W of leads i.e., along the row and transverse to the lengthwise directions of the individual leads. Each slot 62 is in registration with one row of leads. The width of each such slot corresponds to the desired lengthwise dimension along the lead of the frangible section 72 (FIG. 5) to be provided in each lead. Thus, the width of each slot 62 may be about 3 to about 30 microns. Although the slots should be registered with the leads, there is no requirement for registration of the slots and leads in the widthwise direction W of each row. Moreover, the required registration between slot and the leads in the lengthwise direction L need not be particularly precise. Tolerances of about 50 microns or more normally can be accommodated. Mask 60 may be applied as a discrete, preformed element, or else may be formed by photographic techniques on the surface of layer 32. The mask may be formed from any material which will substantially resist the processes to be applied in the succeeding step. For example, the mask may be a sheet of molybdenum, or may include a layer of molybdenum on a polymeric substrate.

In the next stage of the process, radiant energy such as a beam of light 82 from laser 80 is directed onto the surface of mask 60 and scanned along slot 62. The radiant energy ablates or evaporates some of the metal constituting each lead 52. Mask 60 limits application of the radiant energy only to a relatively narrow treatment zone within slot 62. Accordingly, a relatively short portion of each lead, at the intersection of the lead and the treatment zone or slot is affected. The radiant energy from the laser also ablates some of the dielectric layer or polyimide within the treatment zone. After this process, and after removal of the mask, each lead incorporates a thin, frangible section 72 (FIG. 4) in the area which was disposed within the slot 62. The widthwise dimension W of each connection section 52 is substantially unaffected by the ablation process, and hence the widthwise dimension of each lead is substantially constant within the connection section and frangible section 72.

After this stage, the dielectric layer 32 is masked on its bottom surface by a further mask 86 having slots 90 corresponding to the desired locations of the slots 40 in the dielectric layer. Each such slot 90 in the mask is aligned with the connection sections and frangible regions 72. The assembly is then subjected to further ablation by radiant energy directed through slot 90, thereby forming the slots 40 (FIG. 5) in alignment with the connection sections of the leads and in alignment with the frangible regions. The radiant energy applied to provide this ablation typically includes a KrF laser operating under conditions which will substantially ablate the dielectric material such as polyimide of layer 32 but which will not substantially affect the material of the leads. Following formation of the slots, a compliant layer 102 is applied on the bottom surface of layer 32. Layer 102 may be applied by lamination or by coating techniques such as silk screening. Layer 102 desirably is formed from a complaint material such as an elastomer or a gel layer 102 has gaps corresponding to the slots 40 in layer 32.

The completed connection component can be used in the same manner as the connection components described in the '036 International Publication. Thus, each component may be positioned on a semiconductor chip so that rows of contacts on the chips are aligned with slots 40 and hence aligned with the various rows of leads. During the positioning procedure, the connection section of each connection section is substantially maintained in position on the support structure, because both ends of each lead connection sections are supported. Thus, each connection section is positioned with respect to the associated contact by positioning of the connection component with respect to the chip. Each lead is then engaged by a bonding tool and more precisely aligned with the contact on the chip by the bonding tool. As the bonding tool moves each lead downwardly toward the contact, the frangible section of the lead breaks, allowing the lead to move freely into engagement with the contact, and the connection section is permanently bonded to the chip contact. The resulting assembly provides benefits such as thermal expansion compensation, testability, and compact size as described in the '036 International Publication.

Numerous variations and combinations of the features discussed above can be utilized. Thus, the gaps or slots 40 in the dielectric layer can be formed prior to application of the weakening or ablation treatment to the leads, as by removing the polyimide from beneath the leads using relatively low-intensity radiant energy before ablating portions of the leads. Using this approach, the radiant energy applied to ablate the leads and form the frangible sections may be applied through the slot, from the bottom of the dielectric layer. In further variants, the compliant layer 102 may be applied before formation of the slots and before the initial plating process used to form the leads. The slots may be formed by ablation or punching before formation of the leads. In this case, the slots may be filled with a temporary filter to permit plating of the leads.

In a further embodiment, the light from laser 80 is omitted. Instead, the assembly, with mask 60 thereon, is exposed to an alloying element which will diffuse into the material of the leads and weaken it. Desirably, the alloying agent is adapted to embrittle the material of the lead, as by weakening grain boundaries of the lead material. Where the lead material is gold or a gold-based alloy, the alloying agent may be a metal selected from the group consisting of tin, indium, lead, gallium and combinations thereof. Following application of the alloying agent on the surface of the lead, the assembly may be subjected to baking at an elevated temperature to accelerate diffusion of the alloying agent into the lead. These alloying agents can be applied in a vapor-phase process, such as evaporative coating or sputtering, or else can be applied in a liquid-phase process such as electroless plating or electroplating onto the leads through the slot 52 in the mask 60 defining the treatment zone. Here again, the weakening treatment affects only the area of each lead at its intersection with the slot or treatment zone. In a further variant, the weakening treatment may be applied by immersing the assembly, with the mask 60 thereon, in an etchant or in a reverse electroplating bath. Thus, a positive electrical potential applied to the leads will cause removal of lead material only at the exposed areas. The buses 53 provide electrical continuity in this step.

Figure 6:
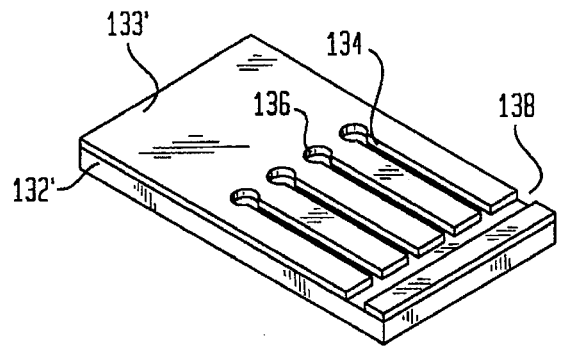
Figure 7:
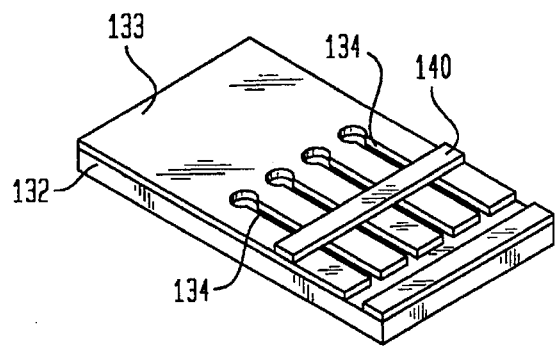

In a further variant, the weakening treatment is applied during deposition of the lead-forming material. As shown in FIG. 6, the process starts with polymer dielectric layer 132 covered by a mask or photoresist layer 133 having openings 134 corresponding to the leads, further openings 136 corresponding to the terminals and openings 138 corresponding to the buses. Each opening 134 thus defines one lead region. The plating process is begun using the mask in this configuration. After a portion of the plating process, a further mask 140 is applied on top of the original mask. Mask 140 is in the form of elongated strips, of which only one is seen in FIG. 7, each such elongated strip extending across a row of lead openings 134 of mask 133. Mask 140 is positioned in the area where the weakened frangible sections are desired, i.e., in the desired treatment zone extending across plural lead regions. Mask 140 may be applied by conventional lithographic techniques. The plating process is continued after application of mask 140. During this portion of the plating process, mask 140 inhibits deposition of the lead material, so that the resulting lead has a thin section in the area covered by mask 140.

Figure 8:
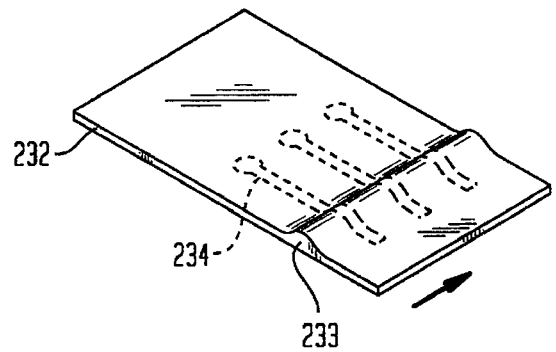

As shown in FIG. 8, the dielectric layer or support structure 232 may be provided with an elongated ridge 233 extending along the treatment zone where the frangible sections are to be formed. In this arrangement, the leads are formed by plating material into lead regions 234 (shown in broken lines) using a mask (not shown) similar to mask 133 of FIG. 6. Here, the upstanding ridge 233 tends to promote formation of a thin section in the plated material at the intersection of each lead region with the ridge.

Figure 9:
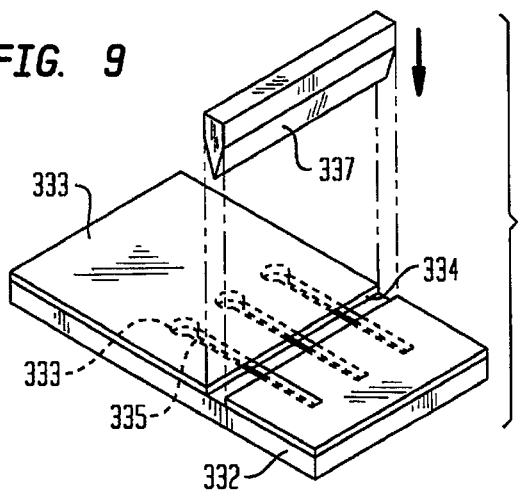

As illustrated in FIG. 9, the weakening treatment may be applied to a continuous layer 333 of conductive, lead-forming material such as a metal, as by scoring the metal layer with an elongated die blade or tool 337 so as to form a groove 334 in the metal layer, extending partially through the thickness of the layer. Alternatively, groove 334 may be formed by chemically etching the continuous layer or laser ablating the layer. The weakening treatment may be applied using a mask similar to mask 60 (FIG. 3). Here again, the weakening treatment is applied throughout an elongated treatment zone extending across a plurality of lead regions 335 (indicated in broken lines in FIG. 9), i.e., across the regions of the continuous sheet which will form the lead connection sections. The layer is then treated, as by subtractive etching, to subdivide it into individual leads, each extending within a lead region 335. In a further variant, any of the other treatments discussed above, such as application of alloying elements, can be applied to the continuous layer 333 prior to formation of the individual leads. Also, a tool such as blade 337 can be used to apply a weakening treatment to rows of individual leads rather than to a continuous layer. In other respects, the process may be as discussed above, and may include formation of a slot or gap in the dielectric layer by the techniques discussed above.

A component according to a further variant has a dielectric support structure including a central portion 442, peripheral portion 444 and slots or gaps 440 extending between the central and peripheral portions. Here again, the leads extend from terminals 448 to connection sections 456 aligned with the gaps 440 of the support structure. In this embodiment, however, the frangible sections 472 of the leads are not aligned with the gaps 440 of the support structure. Rather, the frangible sections of the leads are offset from the gap 440 in the lengthwise direction of the leads (to the right as seen in FIG. 10) so that each frangible section is disposed over the peripheral portion 444 of the support structure. The outer ends 457 of the connection sections overlap the peripheral region of the support structure. In use, when the bonding tool is engaged with a connection section 456 and forced downwardly, the outer end of the connection section is pulled off of the support structure, and the frangible section 472 breaks. Components in accordance with this embodiment of the invention can be fabricated in substantially the same ways as described above. However, the treatment zone used to form the frangible sections is offset laterally from the gap in the support structure, i.e., offset in the direction transverse to the direction of elongation of the elongated treatment zone 452 (indicated in broken lines in FIG. 10) used to form the frangible sections. Here again, the leads can be formed either before or after formation of the gap in the support structure.

As these and other variations and combinations of the features discussed above can be utilized without departing from the present invention as defined by the claims, the foregoing description of the preferred embodiments should be taken by way of illustration rather than by way of limitation of the preferred embodiments.

What is claimed is:

1. A method of making a semiconductor connection component comprising the steps of forming a plurality of elongated leads extending over a gap in a support structure, each said lead including lead-forming material in an elongated, strip-like lead region extending in a lead direction and having longitudinal edge boundaries extending in the lead direction, and forming frangible sections in said leads by applying a weakening treatment to lead-forming material throughout an elongated treatment zone extending across a plurality of said lead regions transverse to said lead directions, whereby said weakening treatment is applied across the longitudinal edge boundaries of said leads.

2. A method as claimed in claim 1 wherein said lead regions extend side-by-side, parallel to one another in a common lead direction and said treatment zone is straight and extends transverse to said common lead direction.

3. A method as claimed in claim 1 wherein said lead-forming step includes the step of depositing lead-forming material within said lead regions.

4. A method as claimed in claim 3 wherein said step of applying said weakening treatment is performed during said depositing step.

5. A method as claimed in claim 3 wherein said step of applying said weakening treatment is performed after said depositing step.

6. A method as claimed in claim 1 wherein said step of forming said leads includes the step of subdividing a continuous layer of said lead-forming material into said leads.

7. A method as claimed in claim 6 wherein said step of applying said weakening treatment is performed before said subdividing step.

8. A method as claimed in claim 6 wherein said step of applying said weakening treatment is performed after said subdividing step.

9. A method as claimed in claim 1 wherein said step of applying said weakening treatment includes the step of applying radiant energy throughout said treatment zone.

10. A method as claimed in claim 9 wherein said step of applying radiant energy includes the step of directing radiant energy into a mask having a slot corresponding to said treatment zone.

11. A method as claimed in claim 9 wherein said step of applying radiant energy includes the step of scanning a beam of radiant energy across said treatment zone so that said beam evaporates lead-forming material from each lead region at an intersection of such lead region with the treatment zone.

12. A method as claimed in claim 1 wherein said step of applying said weakening treatment includes the step of providing a mask having a slot corresponding to said treatment zone and applying a treating material to said lead regions through said slot so that said treating material contacts lead-forming material at intersections between said lead regions and said treatment zone.

13. A method as claimed in claim 12 wherein said treating material is an etchant, said etchant removing material from each said lead region at each said intersection.

14. A method as claimed in claim 12 wherein said treating material is an alloying agent, said alloying agent merging with the lead-forming material at each said intersection to form an alloy therewith.

15. A method as claimed in claim 14 wherein said lead-forming material includes a metal and said alloying agent weakens said metal at grain boundaries.

16. A method as claimed in claim 14 wherein said lead-forming material includes gold and said alloying agent is selected from the group consisting of tin, indium, lead, gallium and combinations thereof.

17. A method as claimed in claim 14 wherein said step of applying said treating material includes the step of providing said alloying agent in a vapor phase.

18. A method as claimed in claim 1 wherein said step of forming said leads includes the step of depositing said lead-forming material on a surface of said support structure, said step of providing a weakening treatment including the step of providing a ridge on said support structure extending throughout said treatment zone and protruding from said surface of said support structure so that said ridge forms an indentation in said deposited lead-forming material in said treatment zone.

19. A method as claimed in claim 18 further comprising the step of removing a portion of said support structure including said ridge to form each said gap in said support structure.

20. A method as claimed in claim 1 wherein said step of applying a weakening treatment includes the step of mechanically engaging a tool with lead-forming material in said treatment zone.

21. A method as claimed in claim 1 further comprising the step of removing a portion of said support structure to form said gap so that said gap is in registry with said lead regions.

22. A method as claimed in claim 1 wherein said treatment zone is aligned with said gap.

23. A method as claimed in claim 1 wherein said treatment zone is offset from said gap.

* * * * *